United States Patent
Ehm et al.

(10) Patent No.: US 9,880,476 B2
(45) Date of Patent: *Jan. 30, 2018

(54) METHOD FOR PRODUCING A CAPPING LAYER COMPOSED OF SILICON OXIDE ON AN EUV MIRROR, EUV MIRROR, AND EUV LITHOGRAPHY APPARATUS

(71) Applicant: CARL ZEISS SMT GMBH, Oberkochen (DE)

(72) Inventors: Dirk Heinrich Ehm, Lauchheim (DE); Gisela von Blanckenhagen, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 516 days.

This patent is subject to a terminal disclaimer.

(21) Appl. No.: 14/227,715

(22) Filed: Mar. 27, 2014

(65) Prior Publication Data

US 2014/0211178 A1    Jul. 31, 2014

Related U.S. Application Data

(63) Continuation of application No. PCT/EP2012/068319, filed on Sep. 18, 2012.

(60) Provisional application No. 61/539,678, filed on Sep. 27, 2011.

(30) Foreign Application Priority Data

Sep. 27, 2011 (DE) .................. 10 2011 083 461

(51) Int. Cl.
| | |
|---|---|
| G03F 7/20 | (2006.01) |
| G02B 1/14 | (2015.01) |
| G21K 1/06 | (2006.01) |
| G02B 1/10 | (2015.01) |
| G02B 5/08 | (2006.01) |
| B82Y 10/00 | (2011.01) |

(52) U.S. Cl.
CPC .............. *G03F 7/702* (2013.01); *B82Y 10/00* (2013.01); *G02B 1/105* (2013.01); *G02B 1/14* (2015.01); *G02B 5/0891* (2013.01); *G03F 7/70316* (2013.01); *G03F 7/70575* (2013.01); *G03F 7/70958* (2013.01); *G21K 1/062* (2013.01)

(58) Field of Classification Search
CPC ..... G03F 1/24; G03F 7/70316; G03F 7/70575
USPC ......................................................... 430/321
See application file for complete search history.

(56) References Cited

U.S. PATENT DOCUMENTS

| | | |
|---|---|---|
| 5,773,100 A | 6/1998 | Chang et al. |
| 9,229,331 B2* | 1/2016 | von Blanckenhagen .. G03F 7/70316 |
| 2006/0066940 A1 | 3/2006 | Trenkler et al. |
| 2006/0134531 A1 | 6/2006 | Song et al. |
| 2006/0138354 A1 | 6/2006 | Bakker et al. |
| 2008/0316595 A1 | 12/2008 | Van Herpen et al. |
| 2009/0002670 A1* | 1/2009 | Melzer ................... G02B 7/005 355/67 |
| 2010/0190113 A1 | 7/2010 | Murakami et al. |
| 2010/0216062 A1 | 8/2010 | Lee et al. |
| 2012/0141923 A1* | 6/2012 | Deweerd ................... G03F 1/48 430/5 |

FOREIGN PATENT DOCUMENTS

| | | |
|---|---|---|
| CN | 1811593 A | 8/2006 |
| DE | 10309084 A1 | 9/2004 |
| EP | 1 065 568 A2 | 1/2001 |
| EP | 1065568 A2 | 1/2001 |
| JP | 2006519386 A | 8/2006 |
| KR | 1020100091061 A | 8/2010 |
| WO | 2008090988 A1 | 7/2008 |
| WO | 2009/059614 A1 | 5/2009 |
| WO | 2010/127845 A1 | 11/2010 |

OTHER PUBLICATIONS

Khanh Nguyen et al., "Top Layer Oxidation in Mo/Si Multilayer X-Ray Mirror", Mat. Res. Soc. Symp. Proc. 1993, pp. 135-143, vol. 306.
International Search Report for PCT/EP2012/068319 dated Mar. 5, 2013.
"Deposition of silicon nitride layers. $Si_3N_4$," 3 pgs. www.crystec.com/trinitre.htm.
English translation of German Office Action for corresponding German Patent Application No. 102011083461.3, dated Sep. 7, 2012, 2 pages.
International Preliminary Report on Patentability for International Application No. PCT/EP2012/068319, dated Apr. 1, 2014, 8 pages.
English translation of Office Action in corresponding Japanese Application No. 2014-532315, dated Mar. 3, 2015.
Office Action in corresponding Chinese Application No. 201280047174.2, dated Oct. 9, 2015, along with an English translation.

* cited by examiner

*Primary Examiner* — Daborah Chacko Davis

(74) *Attorney, Agent, or Firm* — Edell, Shapiro & Finnan, LLC

(57) ABSTRACT

A method for producing a capping layer (18) composed of silicon oxide $SiO_x$ on a coating (16) of a mirror (13), the coating reflecting EUV radiation (6) e.g. for use in an EUV lithography apparatus or in an EUV mask metrology system. The method includes irradiating a capping layer (18) composed of silicon nitride $SiN_x$ or composed of silicon oxynitride $SiN_xO_y$ for converting the silicon nitride $SiN_x$ or the silicon oxynitride $SiN_xO_y$ of the capping layer (18) into silicon oxide $SiO_x$. An associated mirror (13) includes a capping layer comprised of silicon oxide $SiO_x$, and can be provided in an associated EUV lithography apparatus.

9 Claims, 3 Drawing Sheets

_US 9,880,476 B2_

METHOD FOR PRODUCING A CAPPING LAYER COMPOSED OF SILICON OXIDE ON AN EUV MIRROR, EUV MIRROR, AND EUV LITHOGRAPHY APPARATUS

CROSS-REFERENCE TO RELATED APPLICATIONS

This application is a Continuation Application of International Application No. PCT/EP2012/068319, filed Sep. 18, 2012, which claims benefit under 35 U.S.C 119(e) of U.S. Provisional Application No. 61/539,678, filed Sep. 27, 2011, and which claims priority under 35 U.S.C. §119(a) to German Patent Application No. 10 2011 083 461.3, filed Sep. 27, 2011. The entire disclosures of all three related applications are considered part of and are incorporated by reference into the disclosure of the present application.

FIELD OF AND BACKGROUND OF THE INVENTION

The invention relates to a method for producing a capping layer composed of silicon oxide on a coating of a mirror, said coating reflecting EUV radiation. The invention likewise relates to a mirror comprising a capping layer composed of silicon oxide, and to an EUV lithography apparatus comprising such a mirror. The mirror can also be used in a different optical device than an EUV lithography apparatus, e.g. in an EUV mask metrology system.

Projection exposure apparatuses for microlithography serve for producing microstructured components using a photolithographic method. In this case, a structure-bearing mask, the so-called reticle, is imaged onto a photosensitive layer with the aid of a projection optical unit. The minimum feature size that can be imaged with the aid of such a projection optical unit is determined by the wavelength of the imaging light used. The smaller the wavelength of the imaging light used, the smaller the structures that can be imaged with the aid of the projection optical unit. Imaging light having the wavelength of 193 nm or—in so-called EUV lithography apparatuses—imaging light having a wavelength in the range of the extreme ultraviolet (EUV), i.e. 5 nm-30 nm, is principally used nowadays. Reflective optical elements (EUV mirrors) are exclusively used in EUV lithography apparatuses since no optical materials having a sufficiently high transmission at these wavelengths are known.

An EUV mirror for such an EUV lithography apparatus comprises a substrate and a reflective coating having a plurality of layers, said reflective coating being applied to the substrate. Such a multilayer coating generally consists of alternating layers composed of materials having high and low refractive indices, e.g. alternating layers composed of molybdenum and silicon, the layer thicknesses of which are coordinated with one another such that the coating fulfils its optical function and a high reflectivity is ensured. The reflective multilayer coating typically has a capping layer in order to protect the underlying layers against oxidation. Said capping layer can consist of a metallic material, e.g. of ruthenium, rhodium or palladium.

EP 1 065 568 A2 discloses using carbides as materials for the capping layer, e.g. boron carbide ($B_4C$) or silicon carbide (SiC). Nitrides, for example silicon nitride ($Si_3N_4$) or titanium nitride (TiN), are also specified there as materials for the capping layer. Analogously, US 2006/0066940 A1 describes an EUV mirror comprising a capping layer system, wherein alongside silicon nitride ($Si_3N_4$) boron nitride (BN), too, and alongside boron carbide ($B_4C$) molybdenum carbide (MoC) and silicon dioxide ($SiO_2$), too, are proposed as materials for the capping layer system.

It is also known inter alia from the article "Top Layer Oxidation in Mo/Si Multilayer X-Ray Mirror" by Khanh Nguyen et al., Mat. Res. Soc. Symp. Proc. Vol. 306, 1993 (Materials Research Society) that in the case of an Mo/Si multilayer coating in which a layer of silicon forms the terminating or capping layer, a thin film of silicon dioxide ($SiO_2$) forms in ambient air, the thickness thereof typically being between approximately 10 Angstroms and 20 Angstroms.

US 2010/0190113 A1 describes a mirror comprising a capping layer system having a plurality of layers. The topmost layer of the capping layer system can be formed from silicon dioxide, for example, which is applied using a reactive sputtering process.

During the operation of an EUV mirror with such a capping layer composed of silicon dioxide and produced by sputtering in an EUV lithography apparatus, it has been found that during hydrogen cleaning in which the surface of the capping layer is brought into contact with activated hydrogen in order to remove contaminations such as carbon or possibly tin from said layer, a partial conversion or reduction of the silicon dioxide takes place, during which silanes are possibly formed, which has a disadvantageous effect on the reflectivity and/or the uniformity of the reflectivity.

OBJECTS AND SUMMARY OF THE INVENTION

It is an object of the invention to provide a method for producing a capping layer composed of silicon oxide, a mirror comprising such a capping layer, and an EUV lithography apparatus, in which the capping layer has an increased stability of its optical properties during cleaning e.g. with activated hydrogen.

This object is achieved, according to one formulation, by a method of the type mentioned in the introduction, comprising: irradiating a capping layer composed of silicon nitride $SiN_x$ or composed of silicon oxynitride $SiN_xO_y$ for converting the silicon nitride $SiN_x$ or the silicon oxynitride $SiN_xO_y$ of the capping layer into silicon oxide ($SiO_x$). The invention proposes producing a capping layer composed of silicon oxide by subjecting a capping layer composed of silicon nitride or silicon oxynitride $SiN_xO_y$ to radiation until practically the entire nitrogen in the capping layer has been replaced by oxygen, thus resulting in the formation of a capping layer composed of silicon oxide $SiO_x$. A capping layer composed of silicon oxide and produced in this way has proved to be stabler during hydrogen cleaning than a capping layer composed of silicon oxide and produced by direct vapor deposition. The radiation used for the conversion should have wavelengths of less than 390 nm (UV or DUV), wherein in particular EUV radiation, i.e. radiation having wavelengths of less than 30 nm, has proved to be advantageous for the conversion. If appropriate, X-ray radiation, i.e. radiation having wavelengths of less than 5 nm, can be used for the irradiation. The irradiation is typically performed in a gas atmosphere containing oxygen or an oxygen compound.

It is possible, during the irradiation, not to subject the entire surface of the capping layer to radiation, such that the complete conversion of the material of the capping layer takes place only within an irradiated region surrounded, if appropriate, by unirradiated or only weakly irradiated regions in which the capping layer material is not completely converted. In general, however, it is advantageous to irradiate the entire capping layer (in particular homogeneously) in order to convert the material of the entire capping layer into silicon oxide $SiO_x$.

In one variant, the capping layer is irradiated at its surface with EUV radiation having a power density of 200 mW/mm$^2$ or more, in particular of 250 mW/mm$^2$ or more, if appropriate 1000 mW/mm$^2$ or more. It has been found that the power density of the EUV radiation is a determining parameter for the replacement of nitrogen by oxygen in the matrix of the silicon nitride $SiN_x$ or of the silicon oxynitride $SiN_xO_y$ material of the capping layer. In principle, it holds true that high power densities, which are in particular above the threshold value mentioned above, enable fast conversion of the capping layer into a silicon oxide layer.

In a further variant of the method, the irradiation of the capping layer is carried out in an EUV lithography apparatus in which the mirror is arranged (typically prior to an exposure operation of the EUV lithography apparatus). An EUV lithography apparatus typically comprises an EUV light source which can generate the power densities specified above. Therefore, it is appropriate to use an EUV lithography apparatus for the irradiation. In this case, the irradiation is typically effected before the actual exposure operation, wherein the mirrors having the capping layers composed of silicon nitride or silicon oxynitride can, if appropriate, firstly be brought to suitable positions for the irradiation (in particular in proximity to the EUV radiation source) in order to subject them to EUV radiation having a high power density. After the complete conversion of the capping layer, the EUV mirrors can then be brought to the position respectively provided for exposure operation. Alternatively, the irradiation of the EUV mirrors can also be performed in-situ, i.e. at a position corresponding to the position during later exposure. If appropriate, in this case, the beam path from the EUV light source to the mirror can be changed by comparison with the exposure beam path, such that as few reflective optical elements as possible are situated between a mirror respectively to be irradiated and the EUV light source.

Alternatively, the irradiation can also be performed using an EUV light source, a UV light source or an X-ray source which is not part of an EUV lithography apparatus. In this case, the irradiation process typically takes place in an irradiation apparatus specially provided for this purpose.

In a further variant, the irradiation of the capping layer is carried out in a residual gas atmosphere having an oxygen partial pressure $p(O_2)$ of between $10^{-7}$ mbar and $10^{-11}$ mbar, preferably about approximately $10^{-9}$ mbar and/or a water partial pressure $p(H_2O)$ of between $10^{-5}$ mbar and $10^{-9}$ mbar, preferably about approximately $10^{-7}$ mbar. Such an oxygen and/or water partial pressure promotes the replacement of nitrogen by oxygen in the capping layer and can therefore be used for the pre-irradiation of the capping layer. The residual gas atmosphere can be produced in a vacuum environment of the (pre-)irradiation apparatus or in an EUV lithography apparatus. A higher oxygen partial pressure and/or water partial pressure are/is typically used for the pre-irradiation than during operation of the EUV mirror in an EUV lithography apparatus or in an EUV mask metrology system.

Preferably, the capping layer is applied to a silicon layer of the reflective coating in order to promote the deposition of the silicon nitride material or of the silicon oxynitride material. The reflective coating typically has a plurality of individual layers consisting alternately of materials having different refractive indices. If EUV radiation at a wavelength in the range of 13.5 nm is used, then the individual layers usually consist of molybdenum and silicon. Other material combinations such as e.g. molybdenum and beryllium, ruthenium and beryllium or lanthanum and $B_4C$ are likewise possible. In addition to the individual layers described, a reflective coating can also comprise intermediate layers for preventing diffusion and the above-described capping layer for preventing oxidation or corrosion.

In a further variant, the method comprises in a step preceding the irradiation: applying the capping layer composed of silicon nitride or composed of silicon oxynitride by vapor deposition. Since the substrate materials of EUV mirrors typically cannot withstand excessively high temperatures, it is known e.g. from US 2008/0316595 A1 to implement a capping layer composed of silicon nitride by chemical vapor deposition (CVD) involving plasma enhanced chemical vapor deposition (PE-CVD) or low pressure chemical vapor deposition (LP-CVD). These coating methods enable a deposition at lower temperatures than is the case with a conventional chemical vapor deposition.

It has proved to be advantageous to apply the capping layer composed of silicon nitride or silicon oxynitride by physical vapor deposition (PVD), in particular by sputtering (cathode sputtering). PVD methods have the advantage that they can be carried out at comparatively low temperatures, and so the substrate material is not damaged during coating. Sputtering can be carried out using a magnetron, for example as described in WO 2010/127845 A1, wherein so-called "High Power Impulse Magnetron Sputtering (HiPIMS)" and "High Power Pulsed Magnetron Sputtering (HPPMS)" are used to form nitridic layers. The method described in WO 2010/127845 A1 is intended to be suitable, in particular, for producing oxynitride layers having different proportions of oxygen and nitride. Inter alia, silicon nitride ($Si_3N_4$), silicon oxynitride ($SiN_XO_Y$) and, in particular, $Si_{3-2x}O_{2x}N_{4(1-x)}$ (where x is between 0 and 1) are specified as possible types of layers.

In one variant, a nitrogen proportion x in the $SiN_x$ or in the $SiN_xO_y$ of between 0.4 and 1.4, preferably between 0.7 and 1.4, particularly preferably between 1.0 and 1.4 is set when depositing the capping layer. A capping layer which is composed of silicon oxynitride or silicon nitride and is deposited using a PVD process with suitably chosen coating parameters is low in nitrogen, i.e. this material has a significantly lower nitrogen proportion than is predefined by the stoichiometry of conventional silicon nitride ($Si_3N_4$). The nitrogen proportion of the silicon nitride or the silicon oxynitride can be varied within certain limits during coating, for example by suitably choosing the residual gas composition during coating in a vacuum coating apparatus.

In a further variant, an oxygen proportion y<0.9, preferably y<0.4, is set in the $SiN_xO_y$ when applying the capping layer. The oxygen proportion in the silicon oxynitride can also be influenced by the composition of the gas constituents of the residual gas atmosphere.

In a further variant, the method comprises in a step preceding the irradiation: applying the reflective coating to a substrate in such a way that the reflective coating has a reflection maximum at an operating wavelength $\lambda_B$ in the EUV wavelength range and a maximum or a minimum of the field intensity of a standing wave that forms upon the reflection of radiation at the operating wavelength $\lambda_B$ at the reflective coating is arranged at a distance of 0.1 $\lambda_B$ or less from a surface of the capping layer of the reflective coating which forms the interface between the capping layer and the environment.

The inventors have found that a decrease in reflectivity as a result of the replacement of nitrogen by oxygen in the capping layer turns out to be comparatively small (typically approximately 2% or less) if the maximum or the minimum of the standing wave is situated in the region of the surface of the capping layer or of the reflective coating. In order to achieve this, the optical design of the multilayer coating, in particular the layer thicknesses of the layers, can be chosen suitably. Thus, in particular the thickness of the capping layer and/or the thickness of the layer to which the capping layer is applied can be set such that the standing wave has a maximum or a minimum at the surface. Particularly if a minimum of the field intensity of the standing wave is formed at the surface of the capping layer, the differences in reflectivity between a capping layer composed of silicon nitride or silicon oxynitride and a capping layer composed of silicon oxide are very small. Consequently, even the undesirable case where the entire nitrogen in the capping layer is not replaced by oxygen during irradiation leads only to a comparatively small change in the reflectivity of the EUV mirror.

A further aspect of the invention relates to a mirror for use in an EUV lithography apparatus comprising: a substrate and a coating reflective to EUV radiation, said coating having a capping layer composed of silicon oxide $SiO_x$ which is as stable as possible during hydrogen cleaning. Such a capping layer can be obtained, in particular, by the method described above, i.e. by converting a capping layer composed of silicon nitride or silicon oxynitride into a capping layer composed of silicon oxide. It has proved to be advantageous if the capping layer has an oxygen proportion where $1.0<x<2.0$, in particular where $1.8<x<2.0$. The capping layer can, in particular, also have an oxygen proportion of $x=2.0$. In this case, it differs from a capping layer composed of silicon dioxide $SiO_2$, produced by direct vapor deposition (without EUV irradiation), in terms of its crystal structure.

Layers composed of silicon nitride or silicon oxynitride which are applied by physical vapor deposition, in particular, are typically low in nitrogen, i.e. they have a nitrogen proportion of between approximately 0.4 and 1.4, preferably between 0.7 and 1.4, particularly preferably between 1.0 and 1.4.

If the capping layer is produced from $SiN_xO_y$, it has proved to be advantageous if the oxygen proportion y in the capping layer is less than 0.9, preferably less than 0.4.

Particularly if the capping layer is deposited using a sputtering method, it is generally amorphous, which has an advantageous effect on its stability properties.

In one embodiment, the capping layer is applied to a silicon layer of the reflective coating. Applying the capping layer comprised of silicon nitride or silicon oxynitride to a silicon layer has proved to be advantageous for improving the adhesion properties of the capping layer. By contrast, applying the capping layer to a molybdenum layer would possibly lead to the formation of a mixed layer comprising constituents of both the molybdenum layer and the capping layer. Such a mixed layer could consist e.g. of $MoSi_2$, MoN or MoOx.

In a further embodiment, the reflective coating has a reflection maximum at an operating wavelength $\lambda_B$ in the EUV wavelength range and a maximum or a minimum of the field intensity of a standing wave that forms upon the reflection of radiation at the operating wavelength $\lambda_B$ at the reflective coating is arranged at a distance of $0.1 \lambda_B$ or less from a surface of the capping layer of the reflective coating, wherein the surface forms the interface between the capping layer and the environment. The operating wavelength $\lambda_B$ of EUV mirrors in an EUV lithography apparatus is typically approximately 13.5 nm. As explained further above, particularly for the case where the standing wave has an intensity minimum at the surface of the capping layer, it is possible to prevent a decrease in reflectivity even in partial regions of the capping layer in which the irradiation has not led to complete replacement of the nitrogen in the nitride or oxynitride matrix by oxygen.

A further aspect of the invention relates to an EUV lithography apparatus comprising at least one mirror embodied in the manner described above. The mirror is arranged in a residual gas atmosphere situated in an (evacuated) vacuum housing of the EUV lithography apparatus.

As explained further above, the capping layer can be converted into a silicon oxide layer in the EUV lithography apparatus, if appropriate, in-situ, i.e. the mirrors, during the (pre-)irradiation, are already situated at the position in which they will subsequently be used during exposure operation. Alternatively, the irradiation can also be effected in an irradiation apparatus provided especially for this purpose. In both cases, the irradiation can be restricted, if appropriate, to the regions of the capping layer which are arranged in the beam path of the EUV radiation during exposure operation, while conversion of the capping layer material can be dispensed with, if appropriate, in partial regions of the surface of the capping layer which are not directly subjected to the EUV radiation.

Other features and advantages of the invention are evident from the following description of exemplary embodiments of the invention, with reference to the figures of the drawing, which show details significant to the invention, and from the claims. The individual features can be realized in each case individually by themselves or as a plurality in any desired combination in a variant of the invention.

BRIEF DESCRIPTION OF THE DRAWING

Exemplary embodiments are illustrated in the schematic drawing and are explained in the description below. In the figures.

DETAILED DESCRIPTION OF EXEMPLARY EMBODIMENTS

Figure 1:
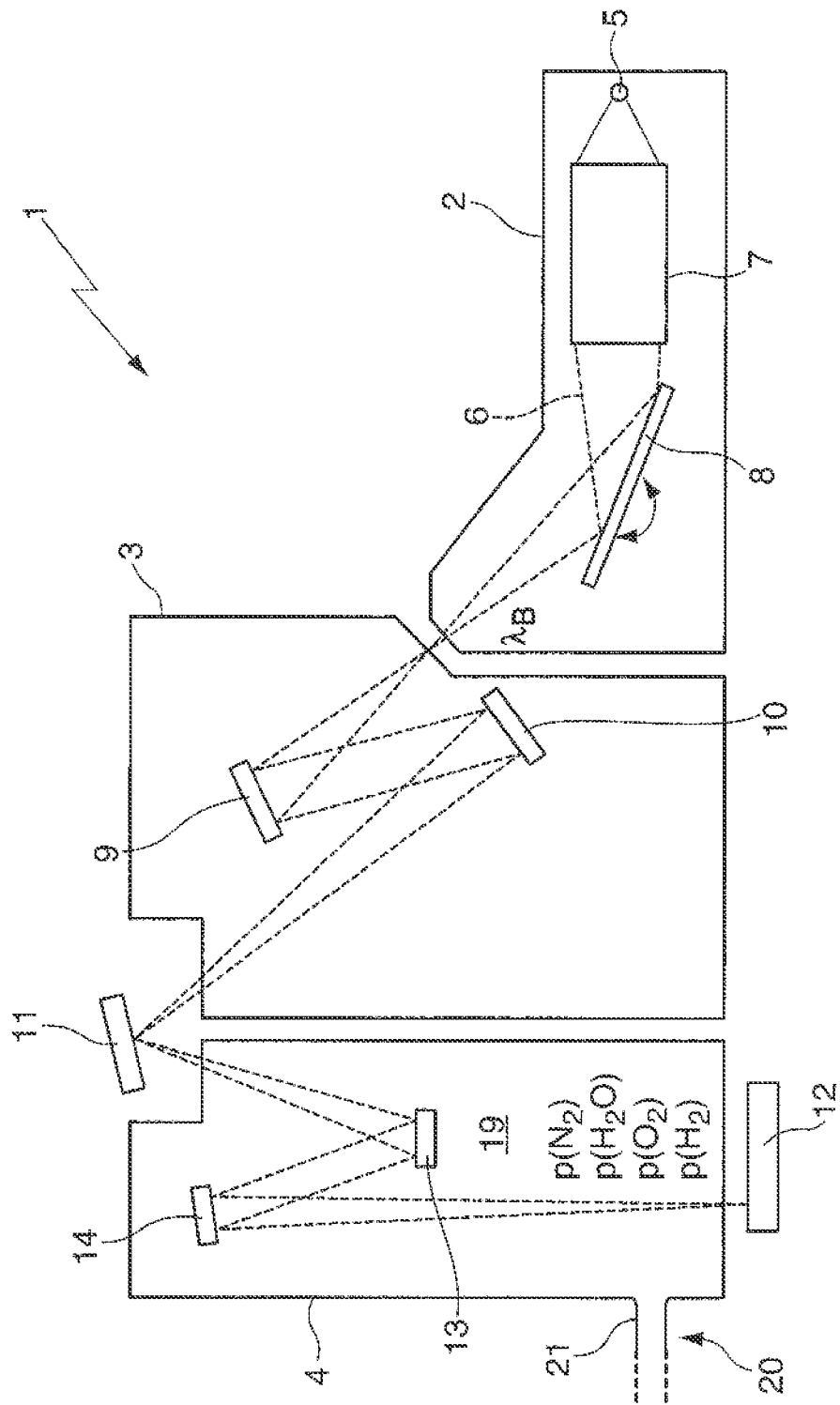
FIG. 1 shows a schematic illustration of an embodiment of an EUV lithography apparatus according to the invention.

FIG. 1 schematically shows a projection exposure apparatus for EUV lithography, which is designated hereinafter as EUV lithography apparatus 1.

The EUV lithography apparatus 1 comprises a ray generating system 2, an illumination system 3 and a projection system 4, which are accommodated in separate vacuum housings and arranged successively in a beam path 6 proceeding from an EUV light source 5 of the ray shaping system 2. By way of example, a plasma source or a synchrotron can serve as EUV light source 5. The radiation in the wavelength range of between approximately 5 nm and approximately 20 nm that emerges from the light source 5 is firstly concentrated in a collimator 7. With the aid of a downstream monochromator 8, the desired operating wavelength $\lambda_B$, which is approximately 13.5 nm in the present example is filtered out by variation of the angle of incidence, as indicated by a double-headed arrow. The collimator 7 and the monochromator 8 are embodied as reflective optical elements.

The radiation treated with regard to wavelength and spatial distribution in the ray generating system 2 is introduced into the illumination system 3, which has a first and second reflective optical element 9, 10. The two reflective optical elements 9, 10 direct the radiation onto a photomask 11 as further reflective optical element, which has a structure that is imaged onto a wafer 12 on a reduced scale by the projection system 4. For this purpose, a third and fourth reflective optical element 13, 14 are provided in the projection system 4.

The reflective optical elements 9, 10, 11, 13, 14 each have an optical surface that is subjected to the EUV radiation 6 from the light source 5. In this case, the optical elements 9, 10, 11, 13, 14 are operated under vacuum conditions in a residual gas atmosphere 19. Since the interior of the projection exposure apparatus 1 cannot be baked out, the presence of residual gas constituents in the vacuum environment cannot be completely avoided.

The EUV lithography apparatus 1 has a gas feed device 20 with a feed channel 21, which is connected to a gas reservoir (not shown) and serves for feeding and for discharging different gas constituents into and from the residual gas atmosphere 19 of the EUV lithography apparatus 1. As is shown in FIG. 1, nitrogen ($N_2$), water ($H_2O$), oxygen ($O_2$) and hydrogen ($H_2$) are present, inter alia, as gas constituents in the residual gas atmosphere 19. Corresponding feed channels can also be provided in the illumination system 3 and/or in the ray generating system 2 or else a central feed channel can be provided for the entire EUV lithography apparatus 1. A control device (not shown) serves to control the gas feed device 20 and to control further functions of the EUV lithography apparatus 1.

The construction of one of the reflective optical elements 13 in the EUV lithography apparatus 1, said element also being designated as EUV mirror hereinafter, is described by way of example hereinafter with reference to FIG. 2. The EUV mirror 13 has a substrate 15 composed of a material having a low coefficient of thermal expansion, which is typically less than 100 ppb/K at 22° C. or over a temperature range of approximately 5° C. to approximately 35° C. One material which has these properties is silicate or quartz glass doped with titanium dioxide, which typically has a silicate glass proportion of more than 90%. One such silicate glass that is commercially available is sold by Corning Inc. under the trade name ULE® (Ultra Low Expansion glass). A further group of materials having a very low coefficient of thermal expansion is glass ceramics, in which the ratio of the crystal phase to the glass phase is set such that the coefficients of thermal expansion of the different phases virtually cancel one another out. Such glass ceramics are offered e.g. by Schott AG under the trade names Zerodur®, and by Ohara Inc. under the trade name Clearceram®. For the reflective optical elements 9, 10 arranged in the illumination system 3, an e.g. metallic substrate material can also be used, if appropriate, instead of a zero expansion material.

A reflective coating 16 is applied to the substrate 15, said reflective coating having a plurality of individual layers 17a, 17b consisting alternately of materials having different refractive indices, specifically in the present case, silicon and molybdenum in the present case. In addition to the individual layers shown in FIG. 2, the reflective coating 16 can also comprise intermediate layers for preventing diffusion or the like. The illustration of such auxiliary layers in the figures has been omitted.

The reflective coating 16 has a capping layer 18 in order to prevent oxidation of the underlying individual layers 17a, 17b and in order to simplify cleaning of contaminating substances attached to the surface 18a of the capping layer 18. The capping layer 18 of the mirror 13 was applied to the topmost silicon layer 17a of the reflecting coating 16 by vapor deposition. The capping layer 18 has a thickness d1 of e.g. approximately 1.5 nm and absorbs the impinging EUV radiation 6 only to a small extent also on account of the small layer thickness. Depending on the application, the layer thickness can be between approximately 1 nm and approximately 20 nm, comparatively large layer thicknesses being used, in particular, in the vicinity of the collector or collimator 7.

In the exemplary embodiment illustrated, the EUV mirror 13 has a planar surface 18a. This was chosen thus merely in order to simplify the illustration, that is to say that the EUV mirror 13 can also have a curved surface form, wherein e.g. concave surface forms or convex surface forms are possible, which can be embodied spherically and also aspherically.

Figure 2:
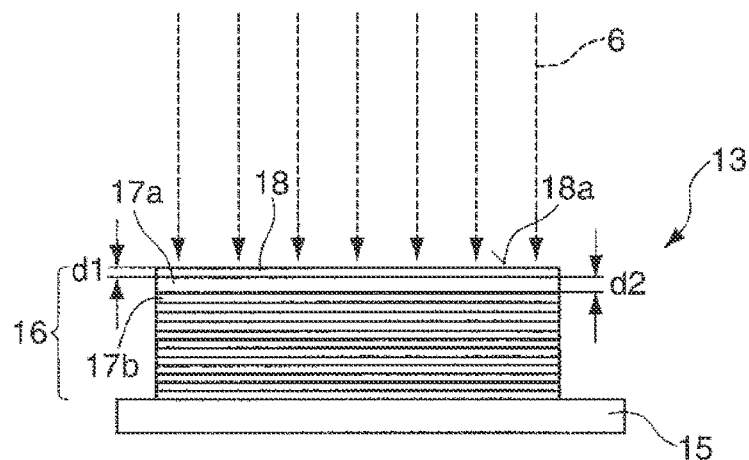
FIG. 2 shows a schematic illustration of an EUV mirror for such an EUV lithography apparatus during irradiation for converting a capping layer composed of silicon oxynitride or silicon nitride into a capping layer composed of silicon oxide, FIGS. 3a,b show two spectra obtained during an XPS analysis of a capping layer composed of silicon oxynitride, FIGS. 4a,b show a comparison of the reflectivity and respectively of the field intensity with regard to the vacuum interface of a standing wave of a reflective coating with a capping layer composed of silicon oxynitride and respectively with a capping layer composed of silicon oxide as a function of the wavelength, and FIGS. 5a,b show an illustration analogous to FIGS. 4a,b wherein the standing wave has a maximum of the field intensity at the surface of the capping layer.

FIG. 2 shows the capping layer 18 during homogeneous irradiation with EUV radiation 6 in order to convert the material of the capping layer 18, which material was applied during the coating of the EUV mirror in the form of silicon oxynitride $SiO_xN_Y$ or of silicon nitride $SiN_x$, into silicon oxide $SiO_x$. The irradiation of the EUV mirror 13 can be effected in an apparatus which is specially designed for this purpose and which has an EUV light source. It is more advantageous if the irradiation is performed directly in the EUV lithography apparatus 1 itself, in particular in-situ, i.e. if the EUV mirror 13 is arranged, during irradiation, at the same location at which it is also used during the exposure operation of the EUV lithography apparatus 1.

In order that the EUV mirror 13 as shown in FIG. 2 is subjected to EUV radiation 6 as homogeneously as possible during irradiation, if appropriate additional reflective optical elements can be provided in the EUV lithography apparatus, which are introduced into the beam path of the EUV light source 5 only during the pre-irradiation, in order to collimate the EUV radiation 6 before it impinges on the EUV mirror 13.

Alternatively, it is possible to arrange the EUV mirror 13 for the conversion of the material of the capping layer 18 at a different location than in the EUV lithography apparatus 1, for example in an irradiation apparatus which is provided separately for this purpose and which enables the capping layer 18 to be prepared in a well-defined manner. In such an irradiation apparatus (not illustrated in the figures), in particular EUV radiation 6 with a collimated beam path can be generated, such that the surface 18a, as shown in FIG. 2, can be subjected homogeneously to EUV radiation. As an alternative to the irradiation of the surface 18a with EUV light, it is also possible to use radiation at other wavelengths, e.g. UV radiation (having wavelengths of <390 nm) or X-ray radiation.

The use of an irradiation apparatus has also proved to be advantageous for producing a high power density (e.g. of more than 200 mW/mm$^2$ or of more than 1000 mW/mm$^2$) at the surface 18*a* of the EUV mirror 13, since said surface 18*a* can be subjected to the radiation of the EUV light source 5 directly, i.e. without reflections that reduce the power density at a plurality of optical elements.

While the EUV mirror 13 is subjected to EUV radiation 6 in the EUV lithography apparatus 1 or in an irradiation apparatus in order to achieve the conversion of the material of the capping layer 18, it has proved to be advantageous to provide there a residual gas atmosphere having a high oxygen proportion, wherein suitable oxygen partial pressures are typically in the range of between approximately $10^{-7}$ mbar and $10^{-11}$ mbar, in particular around approximately $10^{-9}$ mbar. Alternatively or additionally, during the irradiation it is also possible to use a water partial pressure of between approximately $10^{-5}$ mbar and $10^{-9}$ mbar, preferably around approximately $10^{-7}$ mbar, in order to promote the conversion of the capping layer 18. A lower oxygen partial pressure and/or water partial pressure is typically used for exposure operation in an EUV lithography apparatus 1 after the conversion of the capping layer 18.

The application of the reflective coating 16 to the substrate 15 is described in greater detail below. Firstly, the layers 17*a*, 17*b* composed of silicon and composed of molybdenum, respectively, are applied to the substrate 15, for which purpose a PVD method is typically used. The capping layer 18 is then applied to the topmost silicon layer 17*a*, for which purpose a PVD method is likewise used, in the present example preferably a sputtering process, as a result of which the deposited silicon oxynitride $SiN_XO_Y$ or silicon nitride $SiN_X$ has an amorphous structure. In the coating method, both the nitrogen proportion x of the capping layer 18 and the oxygen proportion y (in the case of a capping layer composed of $SiN_XO_Y$) can be set through a suitable choice of the coating parameters, wherein advantageous values for the nitrogen proportion x are between approximately 0.4 and 1.4, preferably between 0.7 and 1.4, and in particular between approximately 1.0 and approximately 1.4. In the case of a capping layer composed of $SiN_XO_Y$, the oxygen proportion y is generally y=0.9, and if appropriate y=0.4 or less, wherein a variation of the respective proportions x and y within the capping layer 18 may be provided in a process-governed manner. A capping layer 18 having a spatially homogeneous composition in which x=1.0 or x>1.0 and y=0.4 or y<0.4 is particularly advantageous.

As described above, the exact composition of the silicon oxynitride $SiN_XO_Y$ or of the silicon nitride SiNx is dependent on the coating parameters. During sputtering, a magnetic field can additionally be used (magnetron sputtering) and, if appropriate, pulsed discharges can be used for the coating, as in the case of so-called "High Power Impulse Magnetron Sputtering (HiPIMS)" or in the case of "High Power Pulsed Magnetron Sputtering (HPPMS)", which are described for example in WO 2010/127845 A1 cited in the introduction. Instead of a PVD method, it is also possible, if appropriate, to apply the capping layer 18 using a CVD method, in particular a PE-CVD or LP-CVD method, cf. the website of Crystec at http://www.crystec.com/trinitre.htm or U.S. Pat. No. 5,773,100 cited in the introduction.

The coating parameters which influence the nitrogen proportion of the capping layer 18 also include the composition of the gas atmosphere during deposition, as described below on the basis of an XPS spectral analysis (cf. FIGS. 3*a,b*) of a silicon oxynitride capping layer 18 applied to a silicon layer 17*a* via a sputtering process. The thicknesses of the layers 17*a*, 17*b* of the reflective coating 16 were chosen in the present example such that they have a reflection maximum at the operating wavelength $\lambda_B$ of 13.5 nm.

Figures 3A, 3B:
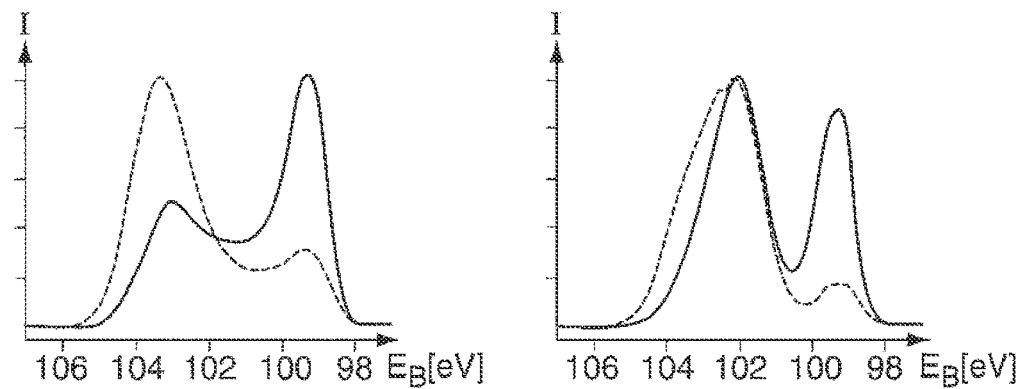

The graphs in FIGS. 3*a,b* illustrate the Si 2p bond of the XPS spectrum (as a function of the bond energy $E_B$), wherein the intensity I of the photoelectrons which emerge at a shallow angle from the surface 18*a* of the capping layer 18 is represented by a dashed curve, while the intensity I of photoelectrons which emerge at a steep angle (virtually perpendicularly) with respect to the surface 18*a* is represented as a solid line. The solid intensity curve thus includes information about the composition of the capping layer 18 at a greater depth, whereas the dashed intensity curve substantially shows information about a near-surface depth range of approximately 1-2 nm of the capping layer 18.

In FIGS. 3*a,b* it can be discerned that the Si 2p spectrum substantially has three peaks at different bond energies $E_B$. A first bond energy $E_B$ at approximately 103.5 eV is characteristic of the oxide bond, a second bond energy $E_B$ at approximately 102 eV corresponds to the silicon nitride bond, while a third bond energy $E_B$ of approximately 99 eV corresponds to the unbound semiconductor state, i.e. unbound, elemental silicon.

The two graphs in FIG. 3*a* and FIG. 3*b* differ in that additional nitrogen in gaseous form was added during the coating process in FIG. 3*b*, while this was not the case in FIG. 3*a*. Comparison between FIG. 3*a* and FIG. 3*b* clearly reveals that the oxygen peak at approximately 103.5 eV in FIG. 3*b* is significantly smaller than in FIG. 3*a*, and that conversely the peak of the nitride bond at approximately 102 eV has risen significantly, i.e. the composition or the stoichiometry of the silicon oxynitride material essentially depends on the composition of the gas atmosphere during coating.

For the case where, during irradiation, undesirably the capping layer 18 is not subjected to EUV radiation 6 at the entire surface 18*a* or, in partial regions of the surface 18*a*, the radiation dose is not high enough for complete conversion of the material of the capping layer 18, it has proved to be advantageous for an antinode or a node of a standing wave that forms in the reflective coating 16 during the irradiation with EUV light 6 to be positioned directly at the surface 18*a* of the capping layer or—if this is not possible—for the distance between the antinode or node of the standing wave and the surface 18*a* to be chosen such that it is not more than 0.1 $\lambda_S$.

In order to achieve this, in particular the thickness d1 of the capping layer 18 and the thickness d2 of the underlying silicon layer 17*a* (and also, if appropriate, the thicknesses of further layers 17*a*, 17*b* of the reflective coating 16) can be chosen suitably. If the above condition is met, even upon incomplete replacement of the nitrogen by oxygen in the capping layer 18 the change in the reflectivity caused thereby is comparatively small, as can be discerned with reference to FIG. 4*a*, which shows the reflectivity R when using a silicon nitride capping layer as a function of the wavelength $\lambda$ at which a node of the standing wave is formed at the surface 18*a*. The coating of the EUV mirror 13, i.e. the thicknesses of the layers 17*a*, 17*b*, are in this case optimized for a capping layer composed of silicon nitride, i.e. the maximum reflectivity R is assumed when using a capping layer 18 composed of silicon nitride.

Figure 4A:
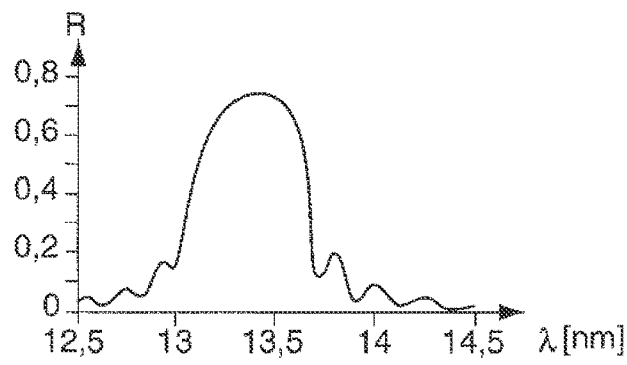
Figure 4B:
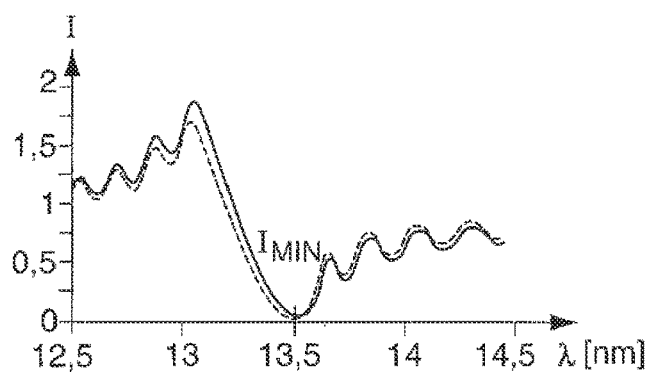

The change in the reflectivity R upon the complete replacement of nitrogen by oxygen is only $\Delta R/R=-0.02\%$ in the case shown in FIG. 4a, and so the associated reflectivity curve for the silicon oxide capping layer 18 cannot be discerned in FIG. 4a since, with the scaling chosen, it corresponds to the reflectivity curve for silicon nitride. FIG. 4b shows the field intensity I at the surface 18a of the capping layer 18 as a function of the wavelength λ, wherein it can clearly be discerned that said field intensity has an intensity minimum $I_{min}$ (i.e. a node of the standing wave) at the operating wavelength $λ_S$ of 13.5 nm.

Figure 5A:
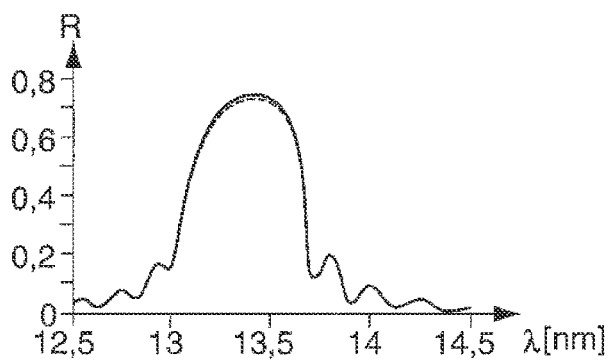
Figure 5B:
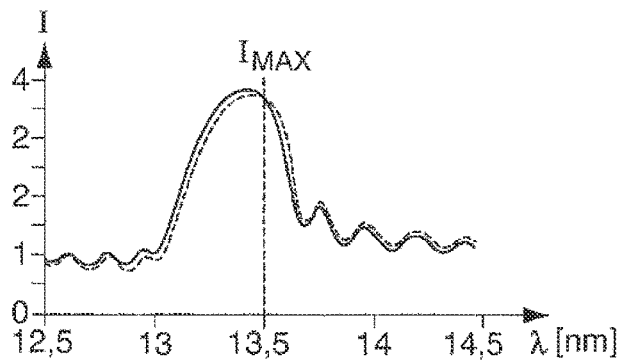

When an antinode is present at the surface 18a of the capping layer 18, the change in the reflectivity when nitrogen is replaced by oxygen is greater and is ΔR/R=−2.1%, as is indicated by a dashed reflectivity curve in FIG. 5a. As is shown in FIG. 5b, the standing wave at the surface 18a of the reflective coating 16 in this case has an intensity maximum $I_{max}$ approximately at the operating wavelength $λ_B$ of 13.5 nm. In order to minimize a reduction of the reflectivity R upon the replacement of oxygen by nitrogen in the capping layer 18, it is therefore particularly advantageous to position an intensity minimum of the standing wave at the location of the surface 18a.

The use of a stable capping layer 18 composed of silicon oxide has proved to be advantageous in particular for removing impurities or particles, in particular metal compounds containing tin or carbon, from the surface 18a of the EUV mirror 13, for which purpose hydrogen cleaning is advantageously carried out, during which activated hydrogen, in particular in the form of hydrogen radicals or hydrogen ions, is applied to the surface 18a.

The hydrogen cleaning can be carried out by setting a suitable hydrogen partial pressure $p(H_2)$ in the residual gas atmosphere 19. The hydrogen can be activated by the EUV radiation 6 in proximity to the surface 18a and in the process can be converted into hydrogen ions or hydrogen radicals which clean contaminating substances such as tin or carbon away from the surface 18a. For the hydrogen cleaning it is also possible, however, to provide additional devices in the EUV lithography apparatus 1, for example cleaning heads that serve to generate a hydrogen-containing gas flow directed onto the surface 18a. Cleaning heads of this type are described for example in WO 2009/059614 A1 from this applicant, which is incorporated by reference into the disclosure of the present application. The hydrogen in the gas flow can be activated hydrogen, wherein the activation can be effected for example using an electric field, as is described in WO 2009/059614 A1, or by guiding the (molecular) hydrogen along a heating wire for the purpose of activation.

The invention claimed is:

1. A method for producing a capping layer composed of silicon oxide $SiO_x$ on a mirror, wherein the mirror comprises a substrate and a reflective coating applied to the substrate, and wherein the reflective coating reflects extreme-ultraviolet (EUV) radiation and comprises the capping layer as a topmost layer of the mirror, said method comprising:
  irradiating the capping layer, which is composed of silicon nitride $SiN_x$ or of silicon oxynitride $SiN_xO_y$ prior to said irradiating, for converting the silicon nitride $SiN_x$ or the silicon oxynitride $SiN_xO_y$ of the capping layer into the silicon oxide $SiO_x$,
  wherein said irradiating of the capping layer is effected in a residual gas atmosphere having at least one of: (i) an oxygen partial pressure ($p(O_2)$) of between $10^{-7}$ mbar and $10^{-11}$ mbar and (ii) a water partial pressure ($p(H_2O)$) of between $10^{-5}$ mbar and $10^{-9}$ mbar.

2. Method according to claim 1, wherein the capping layer is irradiated with EUV radiation having a power density of at least 200 mW/mm$^2$.

3. Method according to claim 1, wherein the mirror is mounted in an EUV lithography apparatus, and said irradiating of the capping layer is carried out in the EUV lithography apparatus.

4. Method according to claim 1, further comprising: prior to said irradiating, applying the capping layer composed of silicon nitride $SiN_x$ or composed of silicon oxynitride $SiN_xO_y$ by vapor deposition onto a layer of the reflective coating.

5. Method according to claim 4, wherein the capping layer is deposited by physical vapor deposition onto the layer of the reflective coating.

6. Method according to claim 4, wherein a nitrogen proportion x in the $SiN_x$ or in the $SiN_xO_Y$ of between 0.4 and 1.4 is set during said applying of the capping layer.

7. Method according to claim 4, wherein an oxygen proportion y<0.9 in the $SiN_xO_y$ is set during said applying of the capping layer.

8. Method according to claim 4, wherein an oxygen proportion y<0.4 in the $SiN_xO_y$ is set during said applying of the capping layer.

9. Method according to claim 1, further comprising: prior to said irradiating, applying the reflective coating to a substrate such that the reflective coating has a reflection maximum at an operating wavelength $λ_B$ in the EUV wavelength range, and wherein a maximum ($I_{max}$) or a minimum ($I_{min}$) of the field intensity (I) of a standing wave that forms upon the reflection of radiation at the operating wavelength $λ_B$ at the reflective coating is arranged at a distance of at most 0.1 $λ_B$ from a surface of the capping layer of the reflective coating.

* * * * *